(12) United States Patent
Byun et al.

(10) Patent No.: US 6,943,576 B2
(45) Date of Patent: Sep. 13, 2005

(54) SYSTEMS FOR TESTING A PLURALITY OF CIRCUIT DEVICES

(75) Inventors: Do-hoon Byun, Kyungki-do (KR); Ki-myung Seo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 10/348,554

(22) Filed: Jan. 20, 2003

(65) Prior Publication Data

US 2003/0155941 A1 Aug. 21, 2003

(30) Foreign Application Priority Data

Feb. 18, 2002 (KR) .................................. 2002-0008472

(51) Int. Cl.⁷ ............................................. G01R 31/26
(52) U.S. Cl. ..................................... 324/765; 324/73.1
(58) Field of Search ................................. 324/754–765, 324/537, 158.1, 73.1; 714/721, 724, 735–736

(56) References Cited

U.S. PATENT DOCUMENTS

| | | | | |
|---|---|---|---|---|
| 5,402,079 A | * | 3/1995 | Levy ........................... | 324/765 |
| 5,568,054 A | * | 10/1996 | Iino et al. .................... | 324/760 |
| 5,751,151 A | * | 5/1998 | Levy et al. .................. | 324/537 |
| 6,087,844 A | * | 7/2000 | Kimata ........................ | 324/765 |
| 6,157,200 A | * | 12/2000 | Okayasu ...................... | 324/753 |
| 6,291,978 B1 | * | 9/2001 | Chandler et al. ........... | 324/73.1 |
| 6,441,637 B1 | * | 8/2002 | Neeb ........................... | 324/771 |
| 6,784,685 B2 | * | 8/2004 | Chao et al. .................. | 324/765 |

* cited by examiner

*Primary Examiner*—Paresh Patel
(74) *Attorney, Agent, or Firm*—Myers Bigel Sibley & Sajovec

(57) ABSTRACT

A test system that tests first through m-th circuit devices for defects. The test system includes a controller and first through m-th control circuits. The controller is configured to generate a test signal having information for testing first through m-th circuit devices. The first through m-th control circuits are each configured to test a respective one of the first through m-th circuit devices for a defect using the test signal, and to stop testing the respective one of the first through m-th circuit devices when a defect is identified.

14 Claims, 10 Drawing Sheets

SYSTEMS FOR TESTING A PLURALITY OF CIRCUIT DEVICES

RELATED APPLICATION

This application claims the benefit of Korean Patent Application No. 2002-0008472, filed Feb. 18, 2002, the disclosure of which is hereby incorporated herein by reference in its entirety as if set forth fully herein.

FIELD OF THE INVENTION

The present invention relates to testing of circuit devices for defects.

BACKGROUND OF THE INVENTION

There are various methods of testing whether an integrated circuit device is normal or defective, including methods of testing one integrated circuit device, and methods of testing a plurality of integrated circuit devices at the same time to reduce test cost. FIG. 1 is a diagram of a test system for testing a plurality of integrated circuit devices at the same time. The known test system 100 has a controller 110 that generates test signals TESTS for testing integrated circuit devices that can be connected to test board units 120, 130, 140 and 150. The test signals TESTS are passed first through m-th relays, RL1 through RLm, that selectively pass or cut-off the test signals TESTS in response to relay control signals RLCT1 through RLCTm generated in the controller 110. The test board units 120, 130, 140 and 150 test integrated circuit devices connected thereto and generate first through m-th test result signals TSTRS1 through TSTRSm. a storage unit 160 temporarily stores the first through m-th test result signals, TSTRS1 through TSTRSm, and provides the signals to the controller 110.

Test signals TESTS are generated according to a test condition set by a test program of the controller 110. The test of integrated circuit devices may be performed on only one item, or continuously on tens or hundreds of test items. The controller 110 has a distributor (not shown) and a plurality of drivers (not shown) for providing the test signals TESTS to a plurality of integrated circuit devices. The test signals TESTS are provided to the first through m-th test board units 120, 130, 140 and 150 through the first through m-th relays RL1 through RLm. In the initial stage for testing, contacts of the first through m-th relays RL1 through RLm are connected to each other. The first through m-th test board units 120, 130, 140 and 150 include first through m-th device under test (DUT) boards DUT1 through DUTm, respectively, and first through m-th comparison units 125, 135, 145, and 155, respectively.

Integrated circuit devices may be connected to the first through m-th DUT boards DUT1 through DUTm. The first through m-th DUT boards DUT1 through DUTm receive the test signals TESTS, test the integrated circuit devices, and then generate first through m-th DUT signals DUTS1 through DUTSm.

The integrated circuit devices each have a plurality of pins to be tested, n, so that each of the DUT signals, DUTS1 through DUTSm, is an n-bit signal with each bit testing one of the plurality of pins. The first through m-th DUT signals, DUTS1 through DUTSm, are provided to the first through m-th comparison units 125, 135, 145, and 155, respectively, so as to determine whether or not the signals provided by the plurality of pins of the integrated circuit device are valid or defective (invalid). Data that is expected for valid signals from each of the pins, normal data, is stored in the first through m-th comparison units 125, 135, 145, and 155. The first through m-th DUT signals DUTS1 through DUTSm are then compared with the normal data. The first through m-th DUT signals DUTS1 through DUTSm that are compared with the normal data and the results of the comparison are provided as first through m-th test result signals TSTRS1 through TSTRSm to the storage unit 160.

The first through m-th test result signals TSTRS1 through TSTRSm stored in the storage unit 160 are sequentially provided as stored test result signals CTSTRS to the controller 110. The controller 110 analyzes the stored test result signals CTSTRS and generates first through m-th relay control signals RLCT1 through RLCTm that control the first through m-th relays RL1 through RLm. After the stored test result signal CTSTRS is analyzed, and if, for example, the integrated circuit devices connected to the first through third DUT boards DUT1 through DUT3 are determined to be defective, the controller 110 disconnects the first through third relays RL1 through RL3, and maintains the connections of the remaining relays RL4 through RLm.

In order to maintain the disconnected states of the first through third relays RL1 through RL3 even when the controller 110 initializes the test system 100 to test a next test item, the controller 110 should store and process a variety of data.

However, in the prior art test system 100, when a plurality of integrated circuit devices are tested for a plurality of test items, test results are read for each integrated circuit device every time, and the controller 110 determines whether or not an integrated circuit device is normal. Accordingly, the test process may take a considerable amount of time. For example, when 100 integrated circuit devices, each having 8 pins, are tested for 100 test items in the prior art test system 100, the amount of data to be processed by the controller 110 is calculated as the number of integrated circuit devices×the number of pins of an integrated circuit device×the number of test items=100×8×100=80,000. Thus, in order to complete tests for 100 integrated circuit devices at the same time, 80,000 data items must be read and processed, such that test time increases greatly. Also, a lot of data communications between the test system and the controller may be necessary, which may significantly increase the test time.

SUMMARY OF THE INVENTION

In some embodiments of the present invention, a test system is provided that tests first through m-th circuit devices for defects. The test system includes a controller and first through m-th control circuits. The controller is configured to generate a test signal having information for testing first through m-th circuit devices. The first through m-th control circuits are each configured to test a respective one of the first through m-th circuit devices for a defect using the test signal, and to stop testing the respective one of the first through m-th circuit devices when a defect is identified.

Accordingly, the test system may provide more localized control of testing at the first through m-th control circuits, which may reduce the time needed to test circuit devices.

In further embodiments of the present invention, the first through m-th circuit devices may be integrated circuit devices, where each integrated circuit device having first through n-th output signals. The first through m-th control circuits may each include a relay, a test unit, and a relay control circuit. The relay may be configured to toggle between transferring the test signal to one of the integrated circuit devices, and preventing the transfer of the test signal, in response to a relay control signal. The test unit may be configured to receive first through n-th device output signals from the integrated circuit device, and to generate a test result signal having information on whether or not one or more of the first through n-th device output signals is defective. The relay control circuit may be configured to generate the relay control signal to toggle the relay to prevent transfer of the test signal to the integrated circuit device when the test result signal indicates that one or more of the first through n-th device output signals are defective.

In other embodiments of the present invention, the test system includes a controller, first through m-th relays, first through m-th test units, first through m-th stepped test result synthesizing units, and first through m-th relay signal control units. The controller is configured to generate a test signal for testing integrated circuit devices. The first through m-th relays are configured to toggle between transferring and stopping the transfer of the test signal in response to first through m-th relay control signals. The first through m-th test units are configured to test integrated circuit devices using the test signal transferred from the first through m-th relays, and to generate first through m-th test result signals having information on whether or not the tested integrated circuit devices are defective. The first through m-th stepped test result synthesizing units are configured to receive the first through m-th test result signals and to generate first through m-th device test result signals having information on the result of the test of the integrated circuit devices. The first through m-th relay signal control units are configured to generate the first through m-th relay control signals controlling the toggling of the first through m-th relays in response to the first through m-th device test result signals.

In other embodiments of the present invention, a relay control method is provided that can be used to control testing of a plurality of integrated circuit devices in a test system. Each of the integrated circuit devices may include first through n-th pins that output signals that are to be tested. First through n-th pin test result signals are generated that indicate whether the first through n-th output signals from each of the integrated circuit devices are defective. A device test result signal is generated for each of the integrated circuit devices, the device test result signal combines the first through n-th pin test result signals to indicate whether any of the first through n-th pins of the an integrated circuit device are providing a defective signal. A relay control signal is generated that isolates a first one of the integrated circuit devices from further testing when the device test result signal indicates that at least one of the first through n-th output signals of the first one of the integrated circuit devices is defective.

DETAILED DESCRIPTION

The present invention will now be described more fully with reference to the accompanying drawings, in which typical embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As will be appreciated by those having skill in the art, the present invention may be embodied as methods or devices. Accordingly, the present invention may take the form of a hardware embodiment, a software embodiment, or an embodiment combining hardware and software aspects. The operations depicted in the diagrams, and combinations thereof, may be implemented in one or more electronic circuits, such as in one or more discrete electronic components, one or more integrated circuits (ICs) and/or one or more application specific integrated circuits (ASICs) and/or application specific circuit modules, as well as by computer program instructions which may be executed by a computer or other data processing apparatus, such as a microprocessor or digital signal processor (DSP). It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will further be understood that when a signal is referred to as being "generated", the logical value represented by the signal, voltage level, and/or other signal characteristic may be changed. It will still be further understood that although the detailed description describes the testing of a "integrated circuit device", the invention is not limited thereto. It will also be understood that "pin" may refer to any conductive path for sensing a signal, including, but not limited to, contacts on a chip, a wire on a circuit board, and an conductive trace within an integrated circuit. Any device that provides electrical output signals in response to test signals may be tested according to the present invention.

Figure 2:
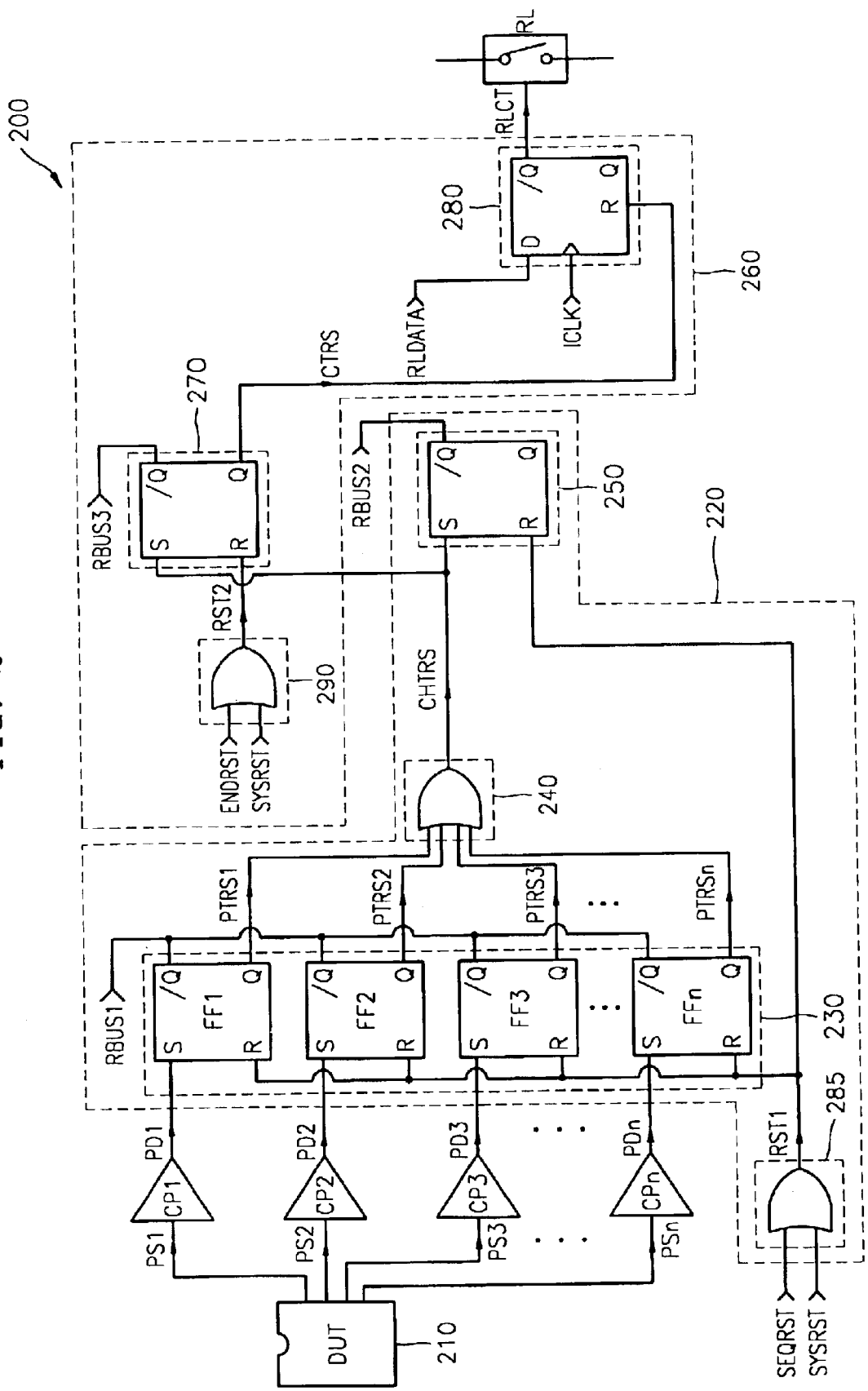
FIG. 2 is a circuit diagram of a relay control circuit according to some embodiments of the present invention.

FIG. 2 is a circuit diagram of a relay control circuit 200 according to embodiments of the present invention. The relay control circuit 200 has a stepped test result synthesizing unit 220 and a relay signal control unit 260.

The stepped test result synthesizing unit 220 is reset in response to a predetermined first reset signal RST1, it receives and stores first through n-th pin data signals PD1 through PDn having test information on pins that are tested on an integrated circuit device, and it generates a device test result signal CHTRS having information on the test result of the integrated circuit device.

According to some embodiments of the present invention, the stepped test result synthesizing unit 220 has a pin data storage unit 230, a pin data synthesizing unit 240, and a temporary storage unit 250. The pin data storage unit 230 is reset in response to a first reset signal RST1, it receives and stores first through n-th pin data signals, PD1 through PDn, and it uses the first through n-th pin data signals, PD1 through PDn, to generate first through n-th pin test result signals, PTRS1 through PTRSn. The pin data synthesizing unit 240 receives the first through n-th pin test result signals, PTRS1 through PTRSn, and generates a device test result signal CHTRS. The temporary storage unit 250 is reset in response to the first reset signal RST1, it receives the device test result signal CHTRS, and it stores the test results of integrated circuit devices.

According to some embodiments of the present invention, the pin data storage unit 230 includes first through n-th flip-flops, FF1 through FFn, which are reset in response to the first reset signal RST1, store respective test results of pins of integrated circuit devices, and generate first through n-th pin test result signals PTRS1 through PTRSn. The temporary storage unit 250 may be a flip-flop, or other latch circuitry or operation. The pin data synthesizing unit 240 may include OR operational logic.

The pin data storage unit 230 may include a first bus RBUS1 that provides the test results of tested integrated circuit devices, the first through n-th pin data signals PD1 through PDn, to other circuitry, including circuitry that may be outside the relay control circuit 200. The temporary storage unit 250 may also include a second bus RBUS2 connected to provide the device test result signal CHTRS, that is stored in the temporary storage unit 250, to other circuitry.

The first reset signal RST1 may change whenever a test item, such as a integrated circuit device, changes. The stepped test result synthesizing unit 220 may include a first reset synthesizing unit 285, which receives a system reset signal SYSRST and a sequential reset signal SEQRST, and when one of the two signals is enabled, generates a first reset signal RST1, such as when a test item changes. The first reset synthesizing unit 285 include OR operational logic.

The relay signal control unit 260 is reset in response to a predetermined second reset signal RST2, receives and stores the device test result signal CHTRS, receives relay data RLDATA having information on an on/off state of a relay RL, and generates a relay control signal RLCT.

In some embodiments of the present invention, the relay signal control unit 260 may include an accumulated result storage unit 270 and a relay control signal generating unit 280. The accumulated result storage unit 270 is reset in response to the second reset signal RST2, it receives and stores a device test result signal CHTRS, and it generates a predetermined control signal CTRS. The relay control signal generating unit 280 is set or reset in response to the control signal CTRS, and receives relay data RLDATA and generates a relay control signal RLCT in response to an internal clock signal ICLK.

The accumulated result storage unit 270 and the relay control signal generating unit 280 may be flip-flops. Also, the accumulated result storage unit 270 further has a third bus RBUS3 which can read from the outside the stored device test result signal CHTRS.

The second reset signal RST2 may be generated when the test of the integrated circuit device is completed. Also, the relay signal control unit 260 can further include a second reset synthesizing unit 290 which receives the system reset signal SYSRST and an end reset signal ENDRST, that may be generated when the test of an integrated circuit device is completed, as may be indicated by when one of the two signals is enabled, and in response thereto, it may generate a second reset signal RST2. The second reset synthesizing unit 290 may include OR operational logic.

FIG. 2 illustrates operation of the relay control circuit according to the embodiments of the present invention. An integrated circuit device having n pins that are to be tested is connected to a device under test (DUT) board 210. The DUT board 210 receives a test signal, and generates first through n-th pin signals PS1 through PSn after testing the pins. The first through n-th pin signals PS1 through PSn are provided to comparison units CP1 through CPn, respectively. Each of the comparison units CP1 through CPn includes a comparator, and test data when a pin of the integrated circuit device is normal. The comparison units CP1 through CPn receive the first through n-th pin signals PS1 through PSn, compare the signals with test data when pins of the integrated circuit device are normal, and generate first through n-th pin data signals PD1 through PDn. Accordingly, the first through n-th pin data signals PD1 through PDn can represent test results of respective pins of the integrated circuit device connected to the DUT board 210.

The relay control circuit 200 according to the embodiments of the present invention can generate a relay control signal RLCT which connects or disconnects a relay RL in response to the first through n-th pin data signals PD1 through PDn. The stepped test result synthesizing unit 220 is reset in response to the predetermined first reset signal RST1, it receives and stores the first through n-th pin data signals PD1 through PDn having test information on respective pins of the integrated circuit device, and it generates a device test result signal CHTRS having information on the test result of the integrated circuit device.

In some embodiments of the present invention, the stepped test result synthesizing unit 220 includes the pin data storage unit 230, the pin data synthesizing unit 240, and the temporary storage unit 250. The pin data storage unit 230 is reset in response to the first reset signal RST1, it receives and stores the first through n-th pin data signals PD1 through PDn, and it generates the first through n-th pin data signals PD1 through PDn as first through n-th pin test result signals PTRS1 through PTRSn. The pin data storage unit 230 may include first through n-th flip-flops, FF1 through FFn, or other latch circuitry or logic.

The first through n-th flip-flops, FF1 through FFn, use stored first through n-th pin data signals, PD1 through PDn, to generate first through n-th pin test result signals, PTRS1 through PTRSn,. As a result, the first through nth pin test result signals, PTRS1 through PTRSn, indicate whether or not respective tested pins of the integrated circuit device, connected to the DUT board 210, are providing valid signals or defective signals (i.e., invalid signals). The test result of the first pin of the integrated circuit device is indicated in the first pin test result signal PTRS1, and the test result of the second pin of the integrated circuit device is indicated in the second pin test result signal PTRS2. Likewise, the test result of the n-th pin of the integrated circuit device is indicated in the n-th pin test result signal PTRSn. In some embodiments of the present invention, a "low" logic level of one of the first through n-th pin test result signals, PTRS1 through PTRSn, indicates that the corresponding pin is providing a valid signal, while a "high" logic level indicates that the corresponding pin is providing a defective signal. In some other embodiments of the present invention, the circuit may be configured differently so that a "low" logic level of one of the first through n-th pin test result signals, PTRS1 through PTRSn, indicates that the corresponding pin is providing a defective signal, while a "high" logic level indicates that the corresponding pin is providing a valid signal. For convenience of explanation, the embodiment described below interprets a "low" logic level of one of the first through n-th pin test result signals, PTRS1 through PTRSn, as indicating that the corresponding pin is providing a valid signal, while a "high" logic level indicates that the corresponding pin is providing a defective signal.

The pin data synthesizing unit 240 receives the first through n-th test result signals PTRS1 through PTRSn and generates a device test result signal CHTRS. The pin data synthesizing unit 240 may include an OR operation circuit. If any one of the first through n-th pin test result signals PTRS1 through PTRSn is a "high" logic level, corresponding to a defect on more or more pins of the integrated circuit device, the pin data synthesizing unit 240 generates a device test result signal CHTRS at a "high" logic level. Accordingly, the logic level of the device test result signal CHTRS indicates whether or not the integrated circuit device connected to the DUT board 210 has a defect. If the pin data storage unit 230 is configured so that a "low" logic level of one of the first through n-th pin test result signals PTRS1 through PTRSn indicates that the corresponding pin has a defect, the pin data synthesizing unit 240 may be include an AND circuit.

The temporary storage unit 250 may be reset in response to the first reset signal RST1, and may receive and store the device test result signal CHTRS. The temporary storage unit 250 may include a flip-flop circuit.

The first reset signal RST1 may be generated whenever a test item for testing an integrated circuit device changes. Accordingly, in the pin data storage unit 230 and the temporary storage unit 250, if a next test item is tested for the integrated circuit device after the test result of one test item is temporarily stored, the stored contents may be reset by the first reset signal RST1.

The stepped test result synthesizing unit 220 may further include the first reset synthesizing unit 285 which receives a system reset signal SYSRST and a sequential reset signal SEQRST that is generated when a test item for testing the integrated circuit device changes, and if any one of the two signals is enabled, may generate the first reset signal RST1. The first reset synthesizing unit 285 may include an OR operation circuit. Accordingly, if any one of the system reset signal SYSRST or the sequential reset signal SEQRST is transited to a "high" logic level, the first reset signal RST1 is generated. Alternatively, if the logic level of the system reset signal SYSRST or the sequential reset signal SEQRST is configured according to "low" logic levels, the first reset synthesizing unit 285 may include an AND operation circuit.

The relay signal control unit 260 may be reset in response to the predetermined second reset signal RST2, and may receive and store the device test result signal CHTRS, receive relay data RLDATA having information on the on/off state of a relay RL, and generate a relay control signal RLCT which turns a relay RL on or off. The relay signal control unit 260 may include the accumulated result storage unit 270 and the relay control signal generating unit 280. The accumulated result storage unit 270 may be reset in response to the second reset signal RST2, receive and store the device test result signal CHTRS, and generate a predetermined control signal CTRS. The accumulated result storage unit 270 may include a flip-flop circuit.

The second reset signal RST2 may be generated when the test of the integrated circuit device is completed and the device test result signal CHTRS, which may be generated by testing the integrated circuit device for all test items, may be stored in the accumulated result storage unit 270. The accumulated result storage unit 270 can store the device test result signal CHTRS and at the same time can generate a control signal CTRS corresponding to the device test result signal CHTRS and provide the signal to the relay control signal generating unit 280. If the device test result signal CHTRS is generated at a "high" logic level which indicates that there is a defect in the integrated circuit device, the control signal CTRS resets the relay control signal generating unit 280. Alternatively, the relationship between the device test result signal CHTRS and the control signal CTRS may be configured opposite with "low" logic levels.

The relay control signal generating unit 280 may be set or reset in response to the control signal CTRS, and receives relay data RLDATA and generates a relay control signal RLCT in response to a predetermined internal clock signal ICLK. The relay control signal generating unit 280 may include a flip-flop circuit. The relay data RLDATA connects and disconnects a relay RL. When there are a plurality of relays, they may be selectively connected or disconnected by the relay data RLDATA. The relay RL may be a switching device such as a relay (switch). The relay control signal generating unit 280 can receive relay data RLDATA in response to the internal clock signal ICLK, connect the relay RL, and then, in response to the control signal CTRS, generate a relay control signal RLCT. If the control signal CTRS is provided at a "high" logic level, the relay control signal RLCT disconnects the connection of the relay RL, while if the control signal CTRS is provided at a "low" logic level, the relay control signal RLCT maintains the connection of the contact of the relay RL. Alternatively, the logical relationship between the control signal CTRS and the relay control signal RLCT may be configured oppositely to respond as to a "low" logic level". If the connection of the relay RL is disconnected by the relay control signal RLCT, the test for the integrated circuit device can stop.

The relay signal control unit 260 may further include the second reset synthesizing unit 290 which receives the system reset signal SYSRST and the end reset signal ENDRST that is generated when the test for the integrated circuit device is completed, and if any one of the two signals is generated, it can generate the second reset signal. The second reset synthesizing unit 290 may include an OR operation circuit. Accordingly, if any one of the system reset signal SYSRST or the end reset signal ENDRST is generated at a "high" logic level, the second reset signal RST2 is generated. If the logic level of the system reset signal SYSRST or the end reset signal ENDRST is configured opposite, "low" logic, the second reset synthesizing unit 290 may include an AND operation circuit.

The pin data storage unit 230 of the stepped test result synthesizing unit 220 may further include the first bus RBUS1 that can conduct the first through n-th pin data signals, PD1 through PDn, stored in the first through n-th flip-flops FF1 through FFN, outside the pin data storage unit 230 and may conduct the signals outside the relay control circuit 200. The second bus RBUS2 may conduct the device test result signal CHTRS, stored in the temporary storage unit 250, outside the pin data storage unit 230 and may conduct the signals outside the relay control circuit 200. Accordingly, the test results of the pins of the integrated circuit device for each test item can be sensed from the first bus RBUS1 and the second bus RBUS2.

The accumulated result storage unit 270 of the relay signal control unit 260 may further include the third bus RBUS3 that can conduct the stored device test result signal CHTRS outside the relay signal control unit 260 and may conduct the signals outside the relay control circuit 200. After a test is completed for all test items, the device test result signal CHTRS may be accumulated in the accumulated result storage unit 270, and the accumulated device test result signal CHTRS may be sensed from the third bus RBUS 3.

The pin data signals, PD1 through PDn, which are test results of respective pins of the integrated circuit device, may be stored in the pin data storage unit 230, and if the first reset signal RST1 is generated, the stored signals may be cleared or removed. The pin data signals PD1 through PDn may be used to generate the device test result signal CHTRS in the pin data synthesizing unit 240. The device test result signal CHTRS may be stored in the temporary storage unit 250. The pin data storage unit 230 and the temporary storage unit 250 may reset by the first reset signal RST1 whenever a test item changes. The pin data storage unit 230 and the temporary storage unit 250 may store the test result of one test item. The test result of the integrated circuit device for a plurality of test items may be stored in the accumulated result storage unit 270, and the accumulated result storage unit 270 can generate a control signal CTRS in response to the stored device test result signal CHTRS. The control signal CTRS resets the relay control signal generating unit 280 such that the connection of the relay RL is disconnected. The relay can be connected or disconnected in direct response to the test results of the integrated circuit device using the relay control circuit 200.

Figure 3:
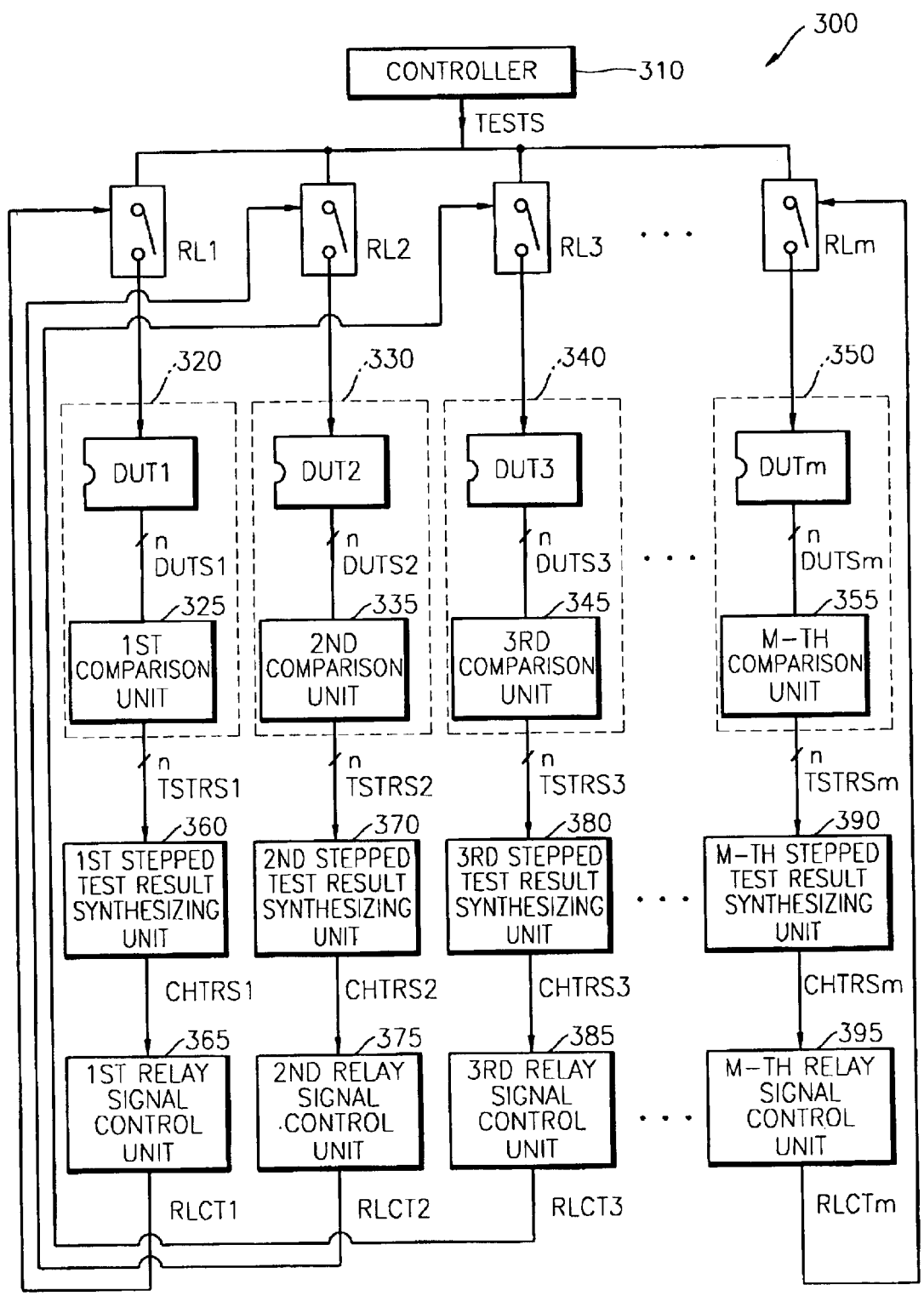
FIG. 3 is a block diagram of a test system according to some embodiments of the present invention.

FIG. 3 is a block diagram showing a test system according to other embodiments of the present invention. The test system can include a controller 310, first through m-th relays RL1 through RLm, first through m-th test board units 320, 330, 340, and 350, first through m-th stepped test result synthesizing units 360, 370, 380, and 390, and first through m-th relay signal control units 365, 375, 385, and 395.

The controller 310 can generate a test signal TESTS having information on test items for testing integrated circuit devices, and can controls the start and end of a test. In response to the predetermined first through m-th relay control signals RLCT1 through RLCTm, the first through m-th relays RL1 through RLm provide the test signals TESTS to the first through m-th test board units 320, 330, 340, and 350, or cut off (isolate) the test signal TESTS therefrom.

The first through m-th test board units 320, 330, 340, and 350 can receive the test signals TESTS provided by the first through m-th relays RL1 through RLm, test the integrated circuit devices, and generate first through m-th test result signals TSTRS1 through TSTRSm having information on whether or not the tested signals are valid or defective (invalid).

More specifically, the first through m-th test board units 320, 330, 340, and 350 have first through m-th DUTs, DUT1 through DUTm, and first through m-th comparison units 325, 335, 345, and 355. The first through m-th DUTs DUT1 through DUTm can receive the test signals TESTS, test the connected integrated circuit devices, and generate first through m-th DUT signals DUTS1 through DUTSm, each DUT signal comprising first through n-th pin signals PS1 through PSn (not shown). The first through m-th comparison units 325, 335, 345, and 355 receive the first through m-th DUT signals DUTS1 through DUTSm, and generate first through m-th test result signals TSTRS1 through TSTRSm, each test result signal comprising first through n-th pin data signals PD1 through PDn (not shown) having information on whether or not the signals provided by the tested pins of the integrated circuit device are valid or defective (invalid).

The first through m-th stepped test result synthesizing units 360, 370, 380, and 390 can respond to the predetermined first reset signal RST1 (not shown), receive the first through m-th test result signals TSTRS1 through TSTRSm, and generate first through m-th device test result signals CHTRS1 through CHTRSm having information on the test results of the integrated circuit devices.

Referring again to FIG. 2, each of the first through m-th stepped test result synthesizing units 360, 370, 380, and 390 can include a pin data storage unit 230, a pin data synthesizing unit 240, and a temporary storage unit 250.

The pin data storage unit 230 can be reset in response to a first reset signal RST1, receive and store first through n-th pin data signals PD1 through PDn, and generate the first through n-th pin data signals PD1 through PDn as first through n-th pin test result signals PTRS1 through PTRSn. The pin data synthesizing unit 240 can receive the first through n-th pin test result signals PTRS1 through PTRSn and generate a device test result signal CHTRS. The temporary storage unit 250 can be reset in response to the first reset signal RST1, receive the device test result signal CHTRS, and store the test result of integrated circuit devices. In some embodiments of the present invention, each of the first through m-th stepped test result synthesizing units 360, 370, 380, and 390 can have the same structure and functions as the stepped test result synthesizing unit 220.

The first through m-th relay signal control units 365, 375, 385, and 395 can receive and store the first through m-th device test result signals CHTRS1 through CHTRSm in response to a predetermined second reset signal, receive first through m-th relay data (not shown) having information on the on/off states of the first through m-th relays RL1 through RMm, and generate first through m-th relay control signals RLCT1 through RLCTm that turn the first through m-th relays RL1 through RLm on or off.

Referring again to FIG. 2, each of the first through m-th relay signal control units 365, 275, 385, and 395 has an accumulated result storage unit 270 and a relay control signal generating unit 280. The accumulated result storage unit 270 can be reset in response to the second reset signal RST2, receive and store a device test result signal CHTRS, and generate a predetermined control signal CTRS. The relay control signal generating unit 280 can be set or reset in response to the control signal CTRS, and receive relay data RLDATA and generate a relay control signal RLCT in response to a predetermined internal clock signal ICLK. In some embodiments of the present invention, each of the first through m-th relay signal control units 365, 275, 385, and 395 can have the same structure and functions as the relay signal control unit 260.

The operation of the test system according to some embodiments of the present invention will now be discussed. The controller 310 can generate test signals TESTS having information on test items for testing integrated circuit devices, and controls the start and end of a test. The test signals TESTS may have information on only one test item, or information on tens or hundreds of test items. The controller 310 has a distributor (not shown) and a plurality of drivers (not shown).

The test signals TESTS generated in the controller 310 are provided to the first through m-th test board units 320, 330, 340, and 350 through the first through m-th relays RL1 through RLm. In the initial stage for testing, contacts of the first through m-th relays RL1 through RLm are connected to each other. Here, relays may be used, but other types of switches can be used according to embodiments of the present invention.

The first through m-th test board units 320, 330, 340 and 350 include first through m-th DUT boards DUT1 through DUTm, respectively, and first through m-th comparison units 325, 335, 345, and 355, respectively.

Integrated circuit devices may be connected to the first through m-th DUT boards DUT1 through DUTm. The first through m-th DUT boards DUT1 through DUTm receive the test signals TESTS, test the integrated circuit devices, and then generate first through m-th DUT signals DUTS1 through DUTSm.

Since an integrated circuit device has a plurality of pins, if the number of pins is n, each of the DUT signals DUTS1 through DUTSm is an n-bit signal, each bit for testing one of the plurality of pins. That is, each of the DUT signals DUTS1 through DUTSm has the first through n-th pin signals PS1 through PSn of the relay control circuit 200 of FIG. 2.

The first through m-th DUT signals DUTS1 through DUTSm are provided to the first through m-th comparison units 325, 335, 345, and 355, respectively, and may be used to determine whether or not the signals provided by the plurality of pins of the integrated circuit device are valid or defective (invalid). Each of the first through m-th comparison units 325, 335, 345, and 355 has n comparators (not shown). Data that represent valid signals (normal data) are stored in the first through m-th comparison units 325, 335, 345, and 355. The first through m-th DUT signals DUTS1 through DUTSm may be compared with the normal data. The first through m-th DUT signals DUTS1 through DUTSm that are compared with the normal data are used to generate first through m-th test result signals TSTRS1 through TSTRSm having information on whether or not the integrated circuit devices are normal, and the test result signals TSTRS1 through TSTRSm are provided to the first through m-th stepped test result synthesizing units 360, 370, 380, and 390. Each of the first through m-th test result signals TSTRS1 through TSTRSm can includes the first through n-th pin data signals PD1 through PDn of FIG. 2.

Figure 1:
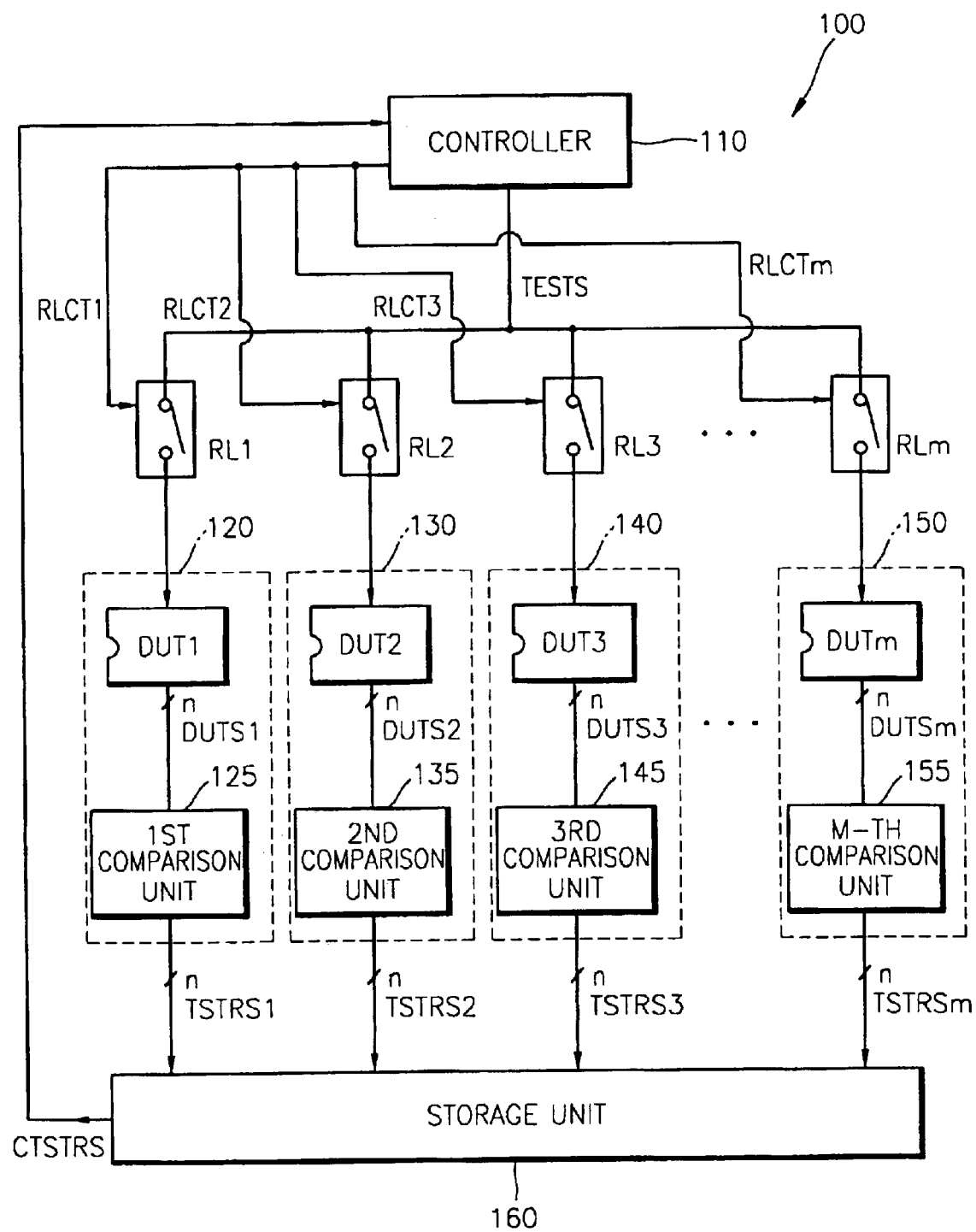
FIG. 1 is a block diagram of a test system for testing a plurality of integrated circuit devices.

In the prior art test system 100 of FIG. 1, the first through m-th test result signals TSTRS1 through TSTRSm generated in the first through m-th test board units 120, 130, 140, and 150 are provided to the storage unit 160, and the storage unit 160 sequentially provides the controller 110 with the stored first through m-th test result signals TSTRS1 through TSTRSm as the stored test result signal CTSTRS. The controller 110 analyzes the stored test result signal CTSTRS, and generates the first through m-th relay control signals RLCT1 through RLCTm which control the first through m-th relays RL1 through RLm so as to connect or disconnect the contacts of the first through m-th relays RL1 through RLm.

In contrast, in the test system 300 according to some embodiments of the present invention as described with regard to FIG. 3, the first through m-th test result signals TSTRS1 through TSTRSm having information on whether or not the signals from the integrated circuit devices are valid or defective are provided to the first through m-th stepped test result synthesizing units 360, 370, 380, and 390. The first through m-th stepped test result synthesizing units 360, 370, 380, and 390 generate the first through m-th device test result signals CHTRS1 through CHTRSm and provide them to the first through m-th relay signal control units 365, 275, 385, and 395. The first through m-th relay signal control units 365, 375, 385, and 395 generate the first through m-th relay control signals RLCT1 through RLCTm so as to connect or disconnect the contacts of the first through m-th relays RL1 through RLm.

In this manner, testing of defective devices may be stopped by disconnecting test signals from the devices using the relays. When the contacts of the first through m-th relays RL1 through RLm are disconnected, integrated circuit devices connected to the test board units cannot receive the test signals TESTS from the controller 310, and tests of the integrated circuit devices stop. Accordingly, it is not necessary for the controller 310 to analyze the test result signal TSTRS and determine whether or not there the signals from the pins of the tested circuit are valid or defective. Such analysis is performed in a decentralized fashion by the relay control circuits.

In contrast to prior art test systems where testing of device signals for defects is centralized at a controller, in the test system 300 of FIG. 3, the first through m-th test result signals TSTRS1 through TSTRSm are provided to the first through m-th stepped test result synthesizing units 360, 370, 380, and 390, and the first through m-th relay signal control units 365, 375, 385, and 395 so that decentralized control is provided for testing circuit devices.

Figure 4:
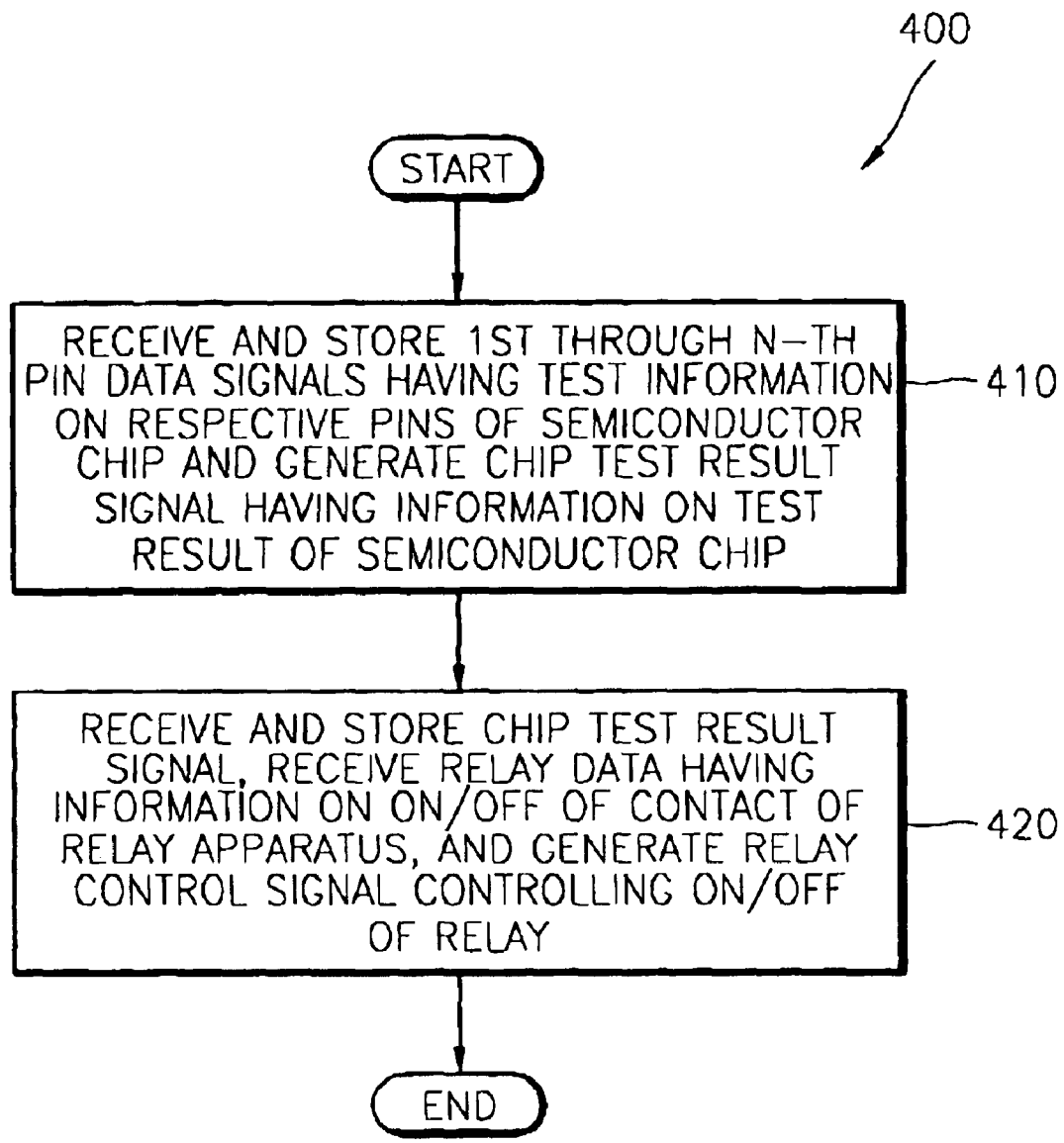
FIG. 4 is a flowchart of operations that may control a relay according to some embodiments of the present invention.
Figure 5:
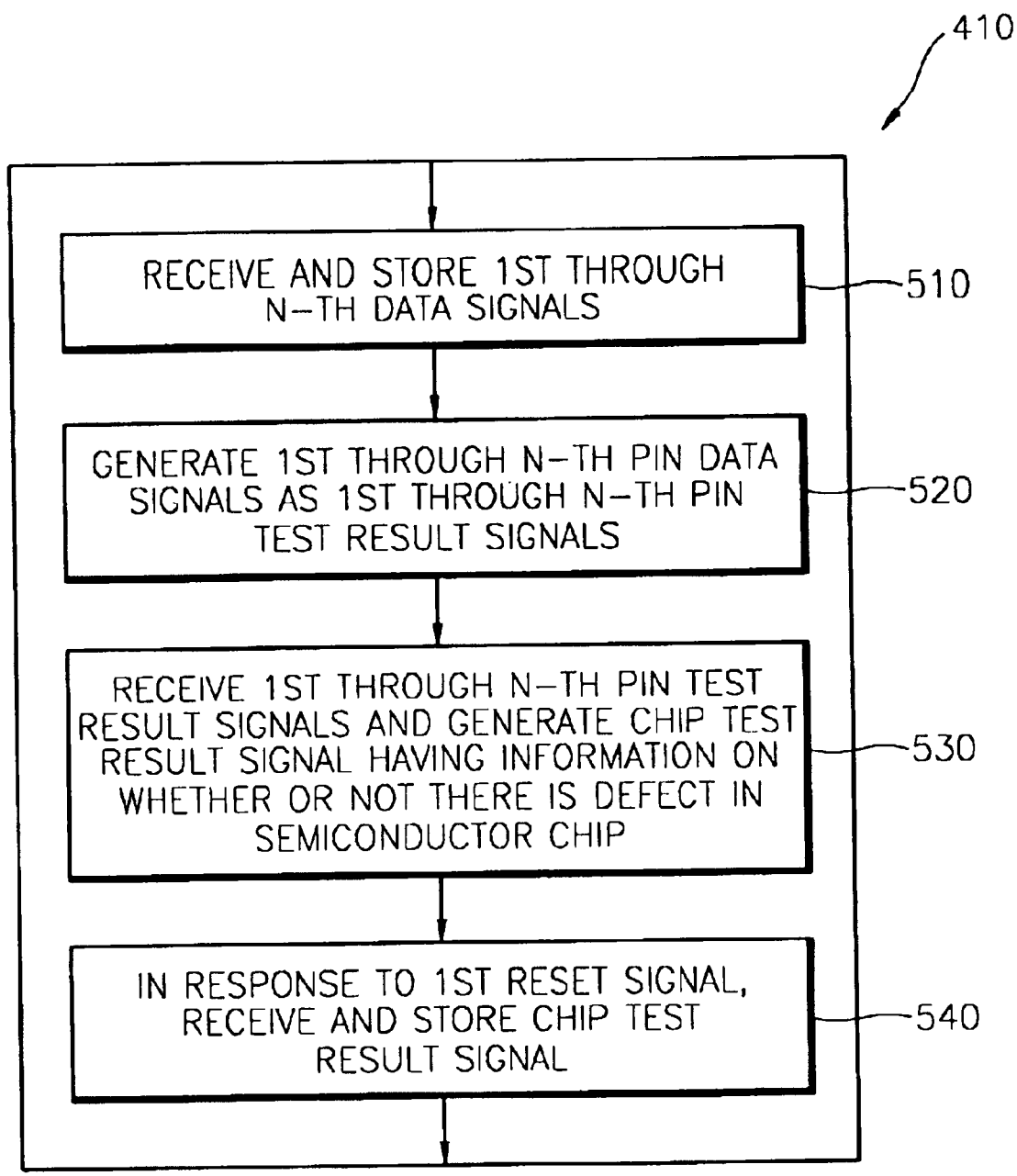
FIG. 5 is a flowchart of operations that may be performed in Block 410 of FIG. 4 according to some embodiments of the present invention.
Figure 6:
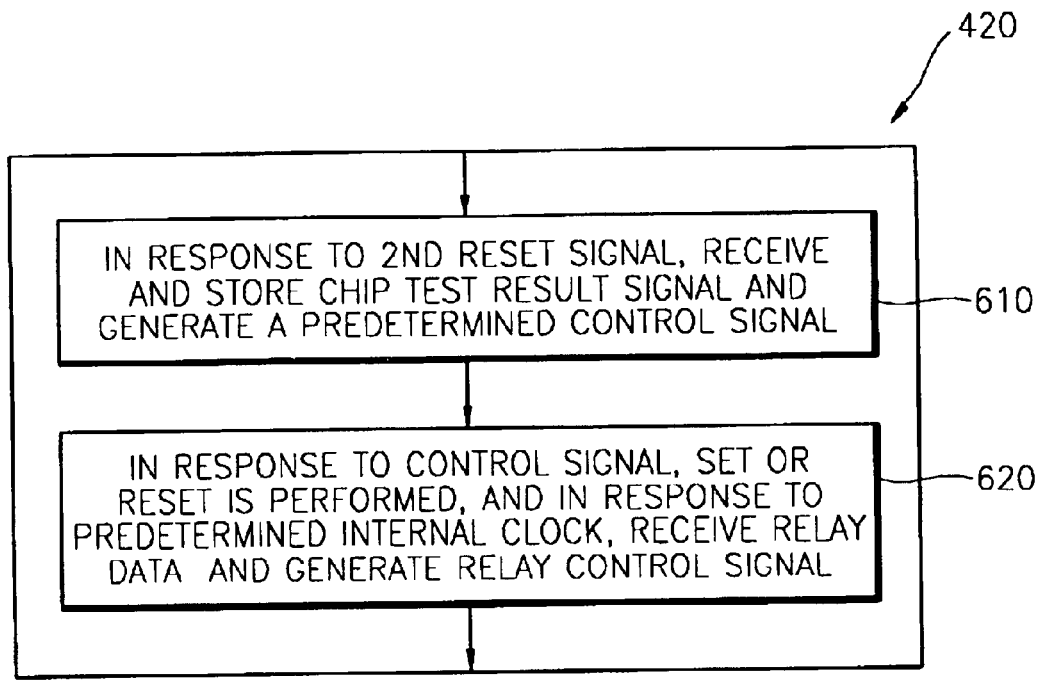
FIG. 6 is a flowchart of operations that may be performed in Block 420 of FIG. 4 according to some embodiments of the present invention.

FIG. 4 is a flowchart showing a relay control method according to some embodiments of the present invention. FIG. 5 is a flowchart of operations that may be performed by Block 410 of FIG. 4 according to some embodiments of the present invention. FIG. 6 is a flowchart of operations that may be performed by Block 420 of FIG. 4 according to some embodiments of the present invention.

Referring to FIGS. 4 through 6, the relay control method according to some embodiments of the present invention includes Block 410 for receiving and storing first through n-th pin data signals having information on the test results of respective pins of the integrated circuit device, and generating a device test result signal having information on the test result of the integrated circuit device, and Block 420 for receiving and storing the device test result signal, receiving relay data having information on connection and disconnection of the contacts of the relays, and generating a relay control signal for turning the relays on or off.

Block 410 can include Block 510 for receiving and storing the first through n-th pin data signals, Block 520 for using the first through n-th pin data signals to generate the first through n-th pin test result signals, Block 530 for receiving the first through n-th pin test result signals and generating the device test result signal having information on whether or not there is a defect in the integrated circuit device, and Block 540 for receiving the device test result signal in response to the first reset signal and storing the device test result of the integrated circuit device.

Block 420 can include Block 610 for receiving and storing the device test result signal in response to the second reset signal, and generating a predetermined control signal, and Block 620 for performing a set or reset in response to the control signal, receiving the relay data in response to a predetermined internal clock signal, and generating the relay control signal.

Referring to FIGS. 2, and 4 through 6, the relay control method according to some other embodiments of the present invention will now be explained. The first through n-th pin data signals having test information on respective pins of the integrated circuit device may be received and stored, and a device test result signal having information on the test result of the integrated circuit device may be generated in Block 410. The first through n-th pin data signals PD1 through PDn are received. The signals have information on the test results of respective pins of the integrated circuit device. For example, a pin data signal generated from a pin having a defect may be a "high" logic level, while another pin data signal generated from a pin having no defect may be a "low" logic level. The logic relationship between the presence of a defect and a pin data signal may be opposite to the case described above. For convenience of explanation, hereinafter, it is assumed that a pin data signal generated from a pin having a defect is a "high" logic level.

The received first through n-th pin data signals PD1 through PDn are stored in the pin data storage unit 230 of FIG. 2 in Block 510. the pin data storage unit 230 is reset by the first reset signal RST1. The first reset signal RST1 is generated whenever a test item for testing the integrated circuit device changes. Therefore, whenever a test item changes, the first through n-th pin data signals PD1 through PDn stored in the pin data storage unit 230 are reset, and new first through n-th pin data signals PD1 through PDn that are test results of a next test item are stored in the pin data storage unit 230. The first through n-th pin data signals PD1 through PDn stored in the pin data storage unit 230 can be read from the outside through the first bus RBUS1.

The first reset signal RST1 may be generated if any one of the system reset signal SYSRST and the sequential reset signal SEQRST may be generated whenever a test item for testing the integrated circuit device changes. The first through n-th pin data signals PD1 through PDn may be used to generate the first through n-th pin test result signals PTRS1 through PTRSn in Block 520. The first through n-th pin test result signals PTRS1 through PTRSn may be received and the device test result signal having information on whether or not there is a defect in the signals from the integrated circuit device may be generated in Block 530. If any one of n pins of the integrated circuit device provided a defective signal, the pin test result signal corresponding to the pin having the defective signal among the first through n-th pin test result signals PTRS1 through PTRSn is generated as a "high" logic level. Then, an OR operation is performed on the first through n-th pin test result signals PTRS1 through PTRSn and the result is output as the device test result signal CHTRS. Therefore, if any one of n pins of the integrated circuit device has a defect, the device test result signal CHTRS is generated as a "high" logic level. The logic level of the device test result signal CHTRS indicates whether or not there is a defect in the integrated circuit device. If the logic level of a pin test result signal corresponding to a pin having a defect is a "low" logic level, an AND operation is performed on the pin test result signals and the result is output as the device test result signal CHTRS.

Block 540 for receiving the device test result signal CHTRS and storing the test result of the integrated circuit device is further included. The device results signal CHTRS may be stored in the temporary storage unit 250 which is reset by the first reset signal RST1.

In Block 420, the device test result signal CHTRS may be received and stored, relay data having information on the on/off states of the contacts of relays may be received, and a relay control signal for turning the relays on and off may be generated. Block 420 may perform as shown in Block 610, in response to the second reset signal, the device test result signal CHTRS may be received and stored, and a predetermined control signal CTRS may be. The control signal CTRS may be a signal controlling relay control signal RLCT as will be explained below.

The device test result signal CHTRS may be stored in the accumulated result storage unit 270 which may be reset by the second reset signal that is generated when the test of the integrated circuit device is completed. Therefore, the device test result signal CHTRS having the test result of the integrated circuit devices for tens or hundreds of test items is stored in the accumulated result storage unit 270. The second reset signal RST2 is generated if any one of the system reset signal SYSRST and the end reset signal ENDRST, which is generated when the test of the integrated circuit device is completed, may be generated.

In Block 620, a set or reset may be performed in response to the control signal CTRS, and relay data RLDATA is received and a relay control signal RLCT is generated in response to a predetermined internal clock signal ICLK.

The relay data RLDATA is used for connection or disconnection of a relay. If relay data RLDATA is provided at the start of the test, the contact of a relay RL selected by the relay data RLDATA is connected. Here, the relay RL means a switching device such as a switch or a relay.

If there is a defect in the signals from the integrated circuit device and the control signal CTRS is generated as a "high" logic level, the relay control signal RLCT is also generated as a predetermined logic level (for example, a "high" logic level), and the contact of the relay RL corresponding to the relay control signal RLCT is disconnected. Therefore, the test for the integrated circuit device stops.

The relay control method 400 according to the some embodiments of the present invention does rely upon a controller to analyze the test result of the integrated circuit device and determines whether or not there is a defect. In the relay control method 400, the relay contact can be turned on and off in direct response to the test result of the integrated circuit device. Therefore, the time taken to test the semiconductor can be reduced.

Figure 7:
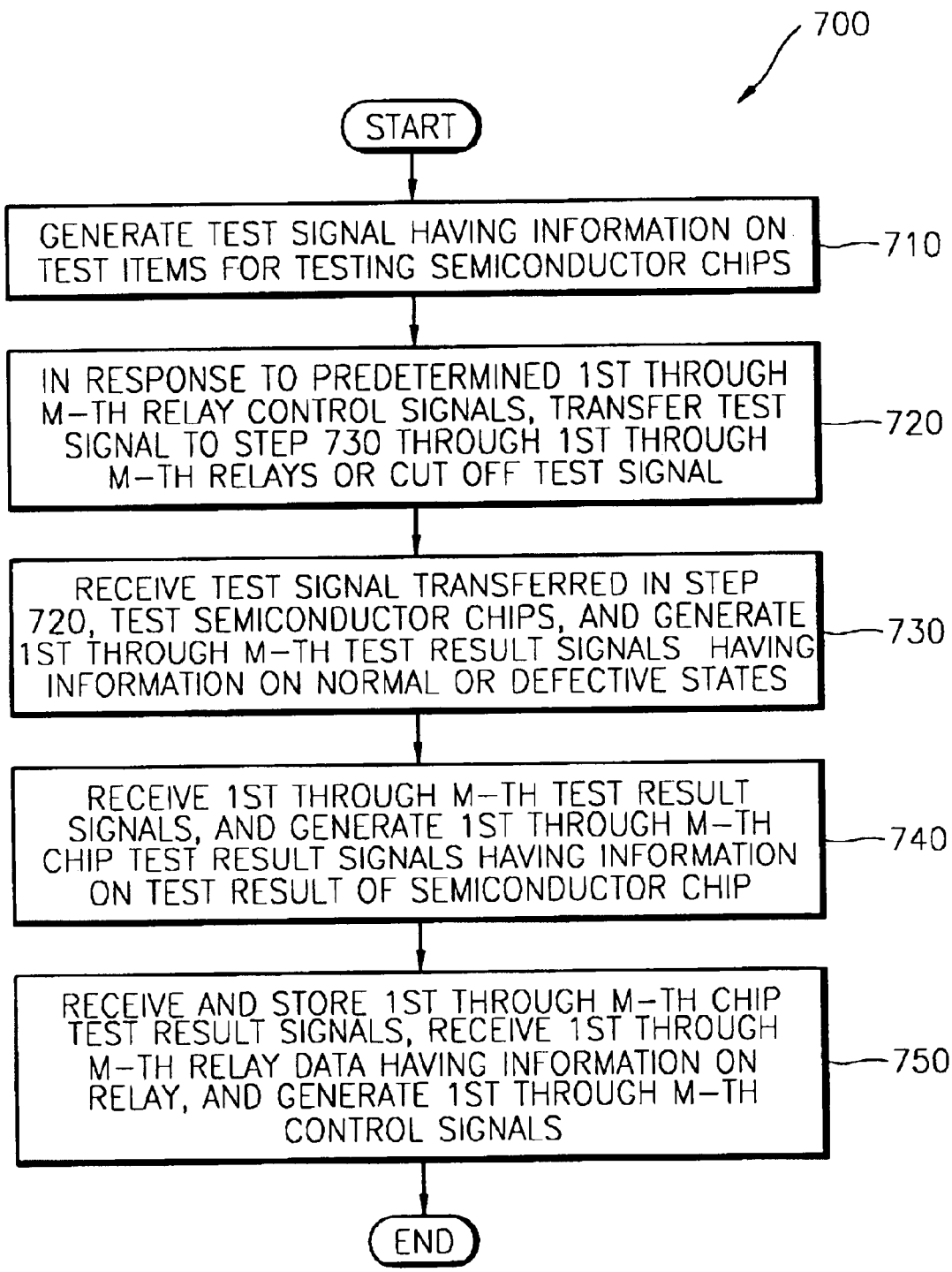
FIG. 7 is a flowchart of operations for testing integrated circuit devices according to some embodiments of the present invention.
Figure 8:
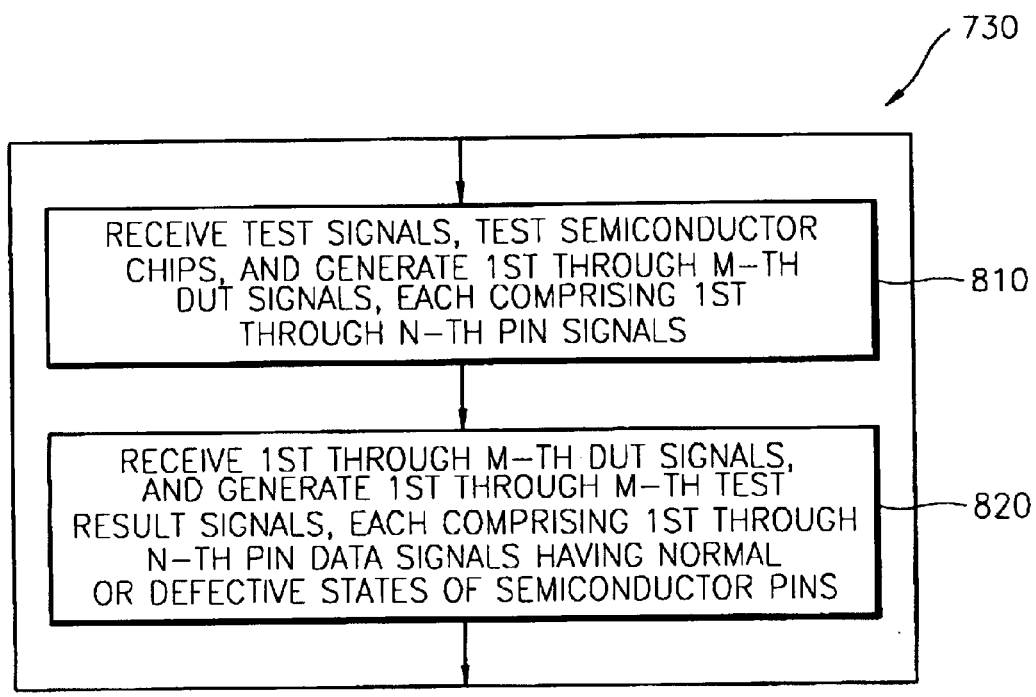
FIG. 8 is a flowchart of operations that may be performed in Block 730 of FIG. 7 according to some embodiments of the present invention.
Figure 9:
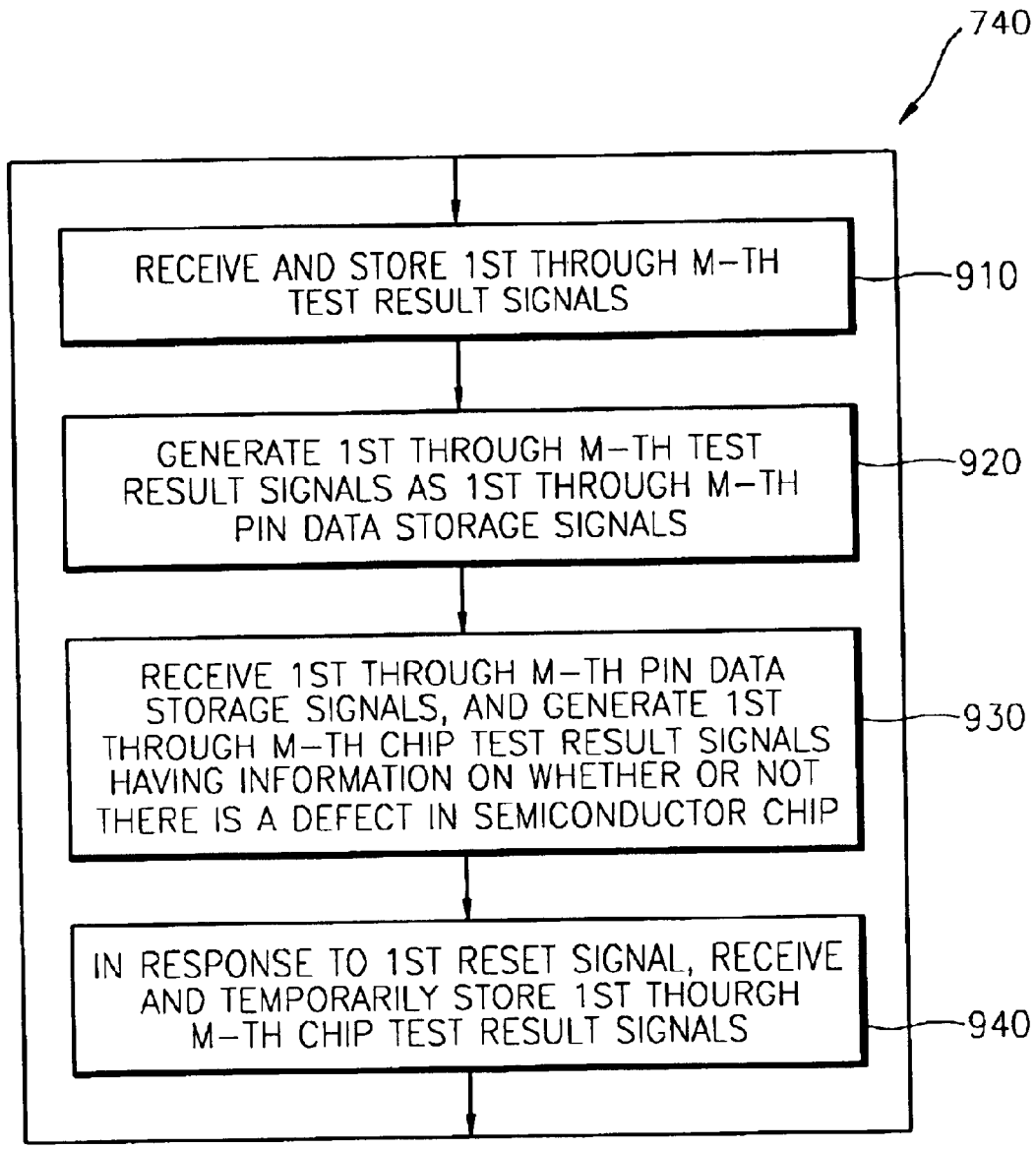
FIG. 9 is a flowchart of operations that may be performed in Block 740 of FIG. 7 according to some embodiments of the present invention.
Figure 10:
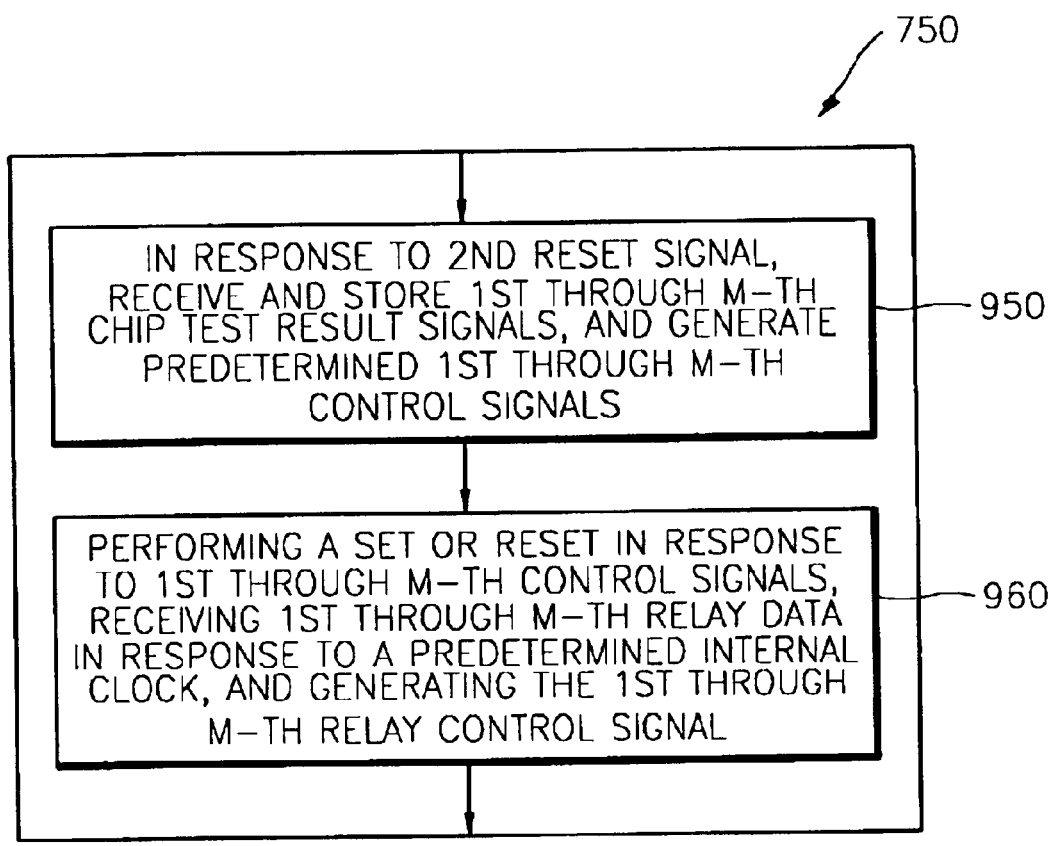
FIG. 10 is a flowchart of operations that may be performed in Block 750 of FIG. 7 according to some embodiments of the present invention.

FIG. 7 is a flowchart showing operations for testing integrated circuit devices according to some embodiments of the present invention. FIG. 8 is a flowchart of operations that may be performed in Block 730 of FIG. 7 according to some embodiments of the present invention. FIG. 9 is a flowchart of operations that may be performed in Block 740 of FIG. 7 according to some embodiments of the present invention. FIG. 10 is a flowchart of operations that may be performed in Block 750 of FIG. 7 according to some embodiments of the present invention.

Referring to FIGS. 7 through 10, the operations for testing integrated circuit devices in a test system that includes first through m-th relays, according to some embodiments of the present invention are show. In Block 710, test signals are generated having information on test items for testing the integrated circuit devices. In Block 720 the test signal is transferred through the first through m-th relays or cut-off (stopped from transferring), in response to predetermined first through m-th relay control signals. In Block 730 the integrated circuit devices are tested and first through m-th test result signals are generated having information on whether there is a defect in the integrated circuit devices. In Block 740 first through m-th device test result signals are generated having information on the test results of the integrated circuit devices. In Block 750 the first through m-th device test result signals are received and stored, first through m-th relay data having information on whether the relay contacts of the first through m-th relays are turned on or off are received, and the first through m-th relay control signals are generated to turn the contacts of the first through m-th relays on or off.

Block 730 can includes Block 810 for receiving the test signal, testing the integrated circuit devices, and generating first through m-th DUT signals, each having first through n-th pin data signals, and Block 820 for receiving the first through m-th DUT signals, and generating first through m-th test result signals, each having first through n-th pin data signals having information on whether there is a defect in the signals from the integrated circuit devices.

Block 740 can include Block 910 for receiving and storing the first through m-th test result signals, Block 920 for using the first through m-th test result signals to generate first through m-th pin data storage signals, Block 930 for receiving the first through m-th pin data storage signals, and generating first through m-th device test result signals having information on whether there is a defect in the signals from the integrated circuit devices, and Block 940 for receiving the first through m-th device test result signals in response to the first reset signal, and temporarily storing the first through m-th device test result signals.

Block 750 includes Block 950 for receiving and storing the first through m-th device test result signals, and generating predetermined first through m-th control signals; and Block 960 for generating a set or reset in response to the first through m-th control signals, receiving the first through m-th relay data in response to a predetermined internal clock signal, and generating the first through m-th relay control signals.

Referring to FIGS. 3, and 7 through 10, the operations for testing integrated circuit devices in a test system according to some embodiments of the present invention will now be explained. The test signal TESTS having information on test items for testing the integrated circuit devices is generated in Block 710. The test signals TESTS are programmed and stored in the controller 310, and have tens or hundreds of test items. In response to predetermined first through m-th relay control signals RLCT1 through RLCTm, the test signals TESTS are transferred to Block 730 through the first through m-th relays RL1 through RLm, or are cut off in Block 720. The test signals transferred from Block 720 are received, the integrated circuit devices are tested, and first through m-th test result signals TSTRS1 through TSTRSm having information on whether or not there is a defect in the integrated circuit devices are generated in Block 730. In Block 730, the test signals TESTS are received, the integrated circuit devices are tested, and first through m-th DUT signals DUTS1 through DUTSm, each having first through n-th pin signals, are generated in Block 810.

One integrated circuit device may be connected to a DUT board to receive the test signals TESTS. N pins of the integrated circuit device are tested, and first through n-th pin signals are generated. First through n-th pin signals form one DUT signal.

The first through m-th DUT signals DUTS1 through DUTSm are received, and first through m-th test result signals, each having first through n-th pin data signals having information on whether there is a defect in the signals provided by the pins of the integrated circuit device, are generated in Block 820. The first through m-th DUT signals DUTS1 through DUTSm are provided to the comparison units 325, 335, 345, and 355. The comparison units 325, 335, 345, and 355 store normal values for expected valid signals, and generate test results from a comparison of the m-th DUT signals DUTS1 through DUTSm to the normal values. The compared results of the first through m-th DUT signals DUTS1 through DUTSm are used to generate first through m-th test result signals TSTRS1 through TSTRSm. Accordingly, the first through m-th test result signals TSTRS1 through TSTRSm have information on whether there is a defect in the signals provided by the pins of the integrated circuit device, and if there is a defect, are generated as a predetermined logic level (for example, a "high" logic level). Alternatively, the test result signals may be set to be generated as a "low" logic level when there is a defect.

The first through m-th test result signals TSTRS1 through TSTRSm are received and first through m-th device test result signals CHTRS1 through CHTRSm having information on the test results of the integrated circuit device are generated in Block 740. The first through m-th test result signals TSTRS1 through TSTRSm are provided to the first through m-th stepped test result synthesizing units 360, 370, 380, and 390. Since each of the first through m-th test result signals TSTRS1 through TSTRSm have first through n-th pin data signals, the operation in Block 740 may be the same as Block 410 of the relay control method 400 according to some embodiments of the present invention. The test result signals, each comprising the first through n-th pin data signals, have information on whether or not there is a defect in the signals provided by the pins of the integrated circuit device, are stored in the stepped test result synthesizing units, and are used to generate the device test result signals having information on whether or not there is a defect in the integrated circuit device. The detailed operation of step 740 is the same as the operation of step 410, and therefore an explanation thereof will be omitted.

In step 750, the first through m-th device test result signals CHTRS1 through CHTRSm are received and stored, the first through m-th relay data having information on whether the contacts of the first through m-th relays RL1 through RLm are on or off are received, and the first through m-th relay control signals RLCT1 through RLCTm which turn the contacts of the first through m-th relays RL1 through RLm on or off are generated.

According to the logic level of the first through m-th device test result signals CHTRS1 through CHTRSm, it can be determined whether or not there is a defect in the integrated circuit device. The first through m-th device test results signals CHTRS1 through CHTRSm are stored in the first through m-th relay signal control units 365, 375, 285, and 395. In response to the first through m-th device test result signals CHTRS1 through CHTRSm, the first through m-th control signals are generated from the inside of the first through m-th relay signals control units 365, 375, 385, and 395, and the first through m-th relay control signals RLCT1 through RLCTm are generated in response to the first through m-th control signals. The first through m-th relay data have information on whether or not to connect the contact of a relay, and when a test begins, contacts are connected by the first through m-th relay data. If the first through m-th control signals are generated as a predetermined level (for example, a "high" logic level) indicating that there is a defect in the integrated circuit device, the first through m-th relay control signals RLCT1 through RLCTm are also generated as the predetermined logic level (for example, a "high" logic level), and the contacts of the first through m-th relays RL1 through RLm corresponding to the first through m-th relay control signals RLCT1 through RLCTm are disconnected. Therefore, the test of the integrated circuit device stops. The detailed operation of step 750 is the same as the operation of step 420 and a detailed explanation will be omitted.

In the test method 700 according to the some embodiments of the present invention, if the contacts of the first through m-th relays corresponding to the first through m-th relay control signals RLCT1 through RLCTm are disconnected, the integrated circuit device cannot receive the test signal TESTS from the controller 310 any more, and the test stops.

Accordingly, in the test system 700 of FIG. 7, if the test for tens or hundreds of test items is completed, the first through m-th test result signals TSTRS1 through TSTRSm are provided to the first through m-th stepped test result synthesizing units 360, 370, 380, and 390, and the first through m-th relay signal control units 365, 375, 385, and 395 such that contacts can be controlled quickly.

As described above, the test system and operations according to embodiments of the present invention may reduce the time needed to test integrated circuit devices by decentralizing how device signals are tested and how testing devices is stopped.

In the drawings and specification, there have been disclosed typical embodiments of the invention and, although specific terms are employed, they are used in a generic and descriptive sense only and not for purposes of limitation, the scope of the invention being set forth in the following claims. For example, when embodiments of the present invention have been described as including one or more features, or at least one of a group of features, it will be understood by one having skill in the art that the embodiment may be configured to perform only one of the features or that it may be configured to perform more than one of the features.

What is claimed is:

1. A test system that tests first through m-th circuit devices for defects, comprising:

a controller that is configured to generate a test signal having information for testing first through m-th circuit devices; and first through m-th control circuits, each configured to test a respective one of the first through m-th circuit devices for a defect using the test signal, and to stop testing the respective one of the first through m-th circuit devices when a defect is identified, wherein the first through m-th circuit devices are integrated circuit devices, each integrated circuit device having first through n-th output signals, and wherein the first through m-th control circuits each comprise:

a relay that is configured to toggle between transferring the test signal to one of the integrated circuit devices, and preventing the transfer of the test signal, in response to a relay control signal;

a test unit that is configured to receive first through n-th device output signals from the integrated circuit device, and to generate a test result signal having information on whether or not one or more of the first through n-th device output signals is defective; and a relay control circuit that is configured to generate the relay control signal to toggle the relay to prevent transfer of the test signal to the integrated circuit device when the test result signal indicates that one or more of the first through n-th device output signals are defective.

2. The test system of claim 1, wherein:

the test unit comprises first through n-th comparators that generate first through n-th test result signals, each comparator is configured compare one of the first though n-th device output signals to a predetermined value and to generate one of the first through n-th test result signals; and the relay control circuit is configured to generate the relay control signal in response to the first through n-th test result signals from the first through n-th comparators.

3. A test system that tests integrated circuit devices for defects, the test system comprising:

a controller that is configured to generate a test signal for testing integrated circuit devices;

first through m-th relays that are configured to toggle between transferring and stopping the transfer of the test signal in response to first through m-th relay control signals;

first through m-th test units that are configured to test integrated circuit devices using the test signal transferred from the first through m-th relays, and to generate first through m-th test result signals having information on whether or not the tested integrated circuit devices are defective;

first through m-th stepped test result synthesizing units that are configured to receive the first through m-th test result signals and to generate first through m-th device test result signals having information on the result of the test of the integrated circuit devices; and first through m-th relay signal control units that are configured to generate the first through m-th relay control signals controlling the toggling of the first through m-th relays in response to respective ones of the first through m-th device test result signals.

4. The test system of claim 3, wherein each of the integrated circuit devices have first through n-th pins that provide output signals, and the first through m-th test units comprise:

first through m-th device under test (DUT) units that are configured to receive the test signal, to test the integrated circuit devices, and to generate first through m-th DUT signals, each of the DUT signals having first through n-th pin signals from the output signals of the tested integrated circuit devices; and first through m-th comparison units that are configured to receive the first through m-th DUT signals, and to generate first through m-th pin test result signals, each pin test result signal having first through n-th pin data signals having information on whether or not there is a defect in the output signals of the integrated circuit devices.

5. The test system of claim 3, wherein each of the first through m-th relay signal control units comprises:

an accumulated result storage unit that is configured to be reset in response to a second reset signal, to receive and store the device test result signal corresponding to the relay signal control unit, and to generate a predetermined first control signal; and a relay control signal generating unit that is configured to be set and reset in response to a first control signal, to receive the relay data in response to a clock signal, and to generate the relay control signal.

6. The test system of claim 5, wherein the accumulated result storage unit and the relay control signal generating unit each comprise a flip-flop circuit.

7. The test system of claim 3, wherein each of the first through m-th stepped test result synthesizing units further comprises a first reset synthesizing unit that is configured to reset the stepped test result synthesizing unit in response to an indication that a new integrated circuit device is to be tested.

8. The test system of claim 3, wherein each of the first through m-th relay signal control units further comprises a second reset synthesizing unit that is configured to reset the relay signal control unit in response to completion of testing of a corresponding one of the integrated circuit devices.

9. The test system of any one of claims 7 and 8, wherein the first and second reset synthesizing units each comprise an OR operation circuit.

10. A test system that tests integrated circuit devices for defects, the test system comprising:
- a controller that is configured to generate a test signal for testing integrated circuit devices;
- first through m-th relays that are configured to toggle between transferring and stopping the transfer of the test signal in response to first through m-th relay control signals;
- first through m-th test units that are configured to test integrated circuit devices using the test signal transferred from the first through m-th relays, and to generate first through m-th test result signals having information on whether or not the test integrated circuit devises are defective;
- first through m-th stepped test result synthesizing units that are configured to receive the first through m-th test result signals and to generate first through m-th device test result signals having information on the result of the test of the integrated circuit devices; and
- first through m-th relay signal control units that are configure to generate the first through m-th relay control signals controlling the toggling of the first through m-th relays in response to respective ones of the first through m-th device test result signals;

wherein:
- each of the integrated circuit devices have first through n-th pins that provide output signals and the first through m-th test units comprise:
  - first through m-th device under test (DUT) units that are configured to receive the test signal, to test the integrated circuit devices, and to generate first through m-th DUT signals, each of the DUT signals having first through n-th pin signals from the output signals of the tested integrated circuit devices; and
  - first through m-th comparison units that are configured to receive the first through m-th DUT signals, and to generate first through m-th pin test result signals, each pin test result signal having first through n-th pin data signals having information on whether or not there is a defect in the output signals of the integrated circuit devices; and
- each of the first through m-th stepped test result synthesizing unit comprises:
  - a pin data storage unit that is configured to receive and store the first through n-th pin data signals, and to provide the first through n-th pin test result signals therefrom;
  - a pin data synthesizing unit that is configured to combine the first through n-th pin test result signals into a device test result signal.

11. The test system of claim 10, wherein the pin data storage unit further comprises:
first through n-th flip-flops that are configured to be reset in response to a first reset signal, to store the first through n-th pin data signals, and to generate the first through n-th pin test result signals.

12. The test system of claim 10, wherein the pin data synthesizing unit comprises an OR operation circuit.

13. The test system of claim 10, wherein each of the first through m-th stepped test result synthesizing unit further comprises a temporary storage unit that stores the device test result signal, wherein the temporary storage unit comprises a flip-flop circuit that is configured to be reset in response to a first reset signal, and to store the device test result signal.

14. The test system of claim 10, wherein the pin data storage unit further comprises a first bus that is configured to conduct the first through n-th pin data signals to outside the first through n-th stepped test result synthesizing units, and the temporary storage unit further comprises a second bus that is configured to conduct the stored device test result signal to outside the first through n-th stepped test result synthesizing units.

* * * * *